(12) United States Patent
Brandes

(10) Patent No.: US 8,022,388 B2
(45) Date of Patent: Sep. 20, 2011

(54) BROADBAND LIGHT EMITTING DEVICE LAMPS FOR PROVIDING WHITE LIGHT OUTPUT

(75) Inventor: George Brandes, Raleigh, NC (US)

(73) Assignee: Cree, Inc., Durham, NC (US)

( * ) Notice: Subject to any disclaimer, the term of this patent is extended or adjusted under 35 U.S.C. 154(b) by 199 days.

(21) Appl. No.: 12/371,226

(22) Filed: Feb. 13, 2009

(65) Prior Publication Data

US 2009/0206322 A1 Aug. 20, 2009

Related U.S. Application Data

(60) Provisional application No. 61/029,093, filed on Feb. 15, 2008.

(51) Int. Cl.
*H01L 33/00* (2010.01)
(52) U.S. Cl. ...... 257/13; 257/79; 257/100; 257/E33.008
(58) Field of Classification Search ............... 257/13, 257/79, 100, E33.008
See application file for complete search history.

(56) References Cited

U.S. PATENT DOCUMENTS

| | | | |
|---|---|---|---|
| 5,061,970 | A | 10/1991 | Goronkin |
| 5,563,900 | A | 10/1996 | Ackley et al. |
| 5,780,867 | A | 7/1998 | Fritz et al. |
| 5,851,905 | A | 12/1998 | McIntosh et al. |
| 6,504,171 | B1 | 1/2003 | Grillot et al. |
| 6,734,467 | B2 | 5/2004 | Schlereth et al. |
| 2004/0056258 | A1 | 3/2004 | Tadatomo et al. |
| 2004/0217364 | A1 | 11/2004 | Tarsa et al. |
| 2006/0081871 | A1 | 4/2006 | Streubel |
| 2006/0152140 | A1 | 7/2006 | Brandes |

FOREIGN PATENT DOCUMENTS

| EP | 1 160 883 A2 | 12/2001 |
|---|---|---|
| WO | WO 2005/076374 A1 | 8/2005 |

OTHER PUBLICATIONS

International Search Report and Written Opinion (15 pages) corresponding to International Application No. PCT/US2009/000943; Mailing Date: Jul. 23, 2009.

*Primary Examiner* — Cuong Q Nguyen
*Assistant Examiner* — Trang Q Tran
(74) *Attorney, Agent, or Firm* — Myers Bigel Sibley & Sajovec

(57) ABSTRACT

A multi-chip light emitting device (LED) lamp for providing white light includes first and second broadband LED chips. The first LED chip includes a multi-quantum well active region having a first plurality of alternating active and barrier layers. The first plurality of active layers respectively include different relative concentrations of at least two elements of a first semiconductor compound, and are respectively configured to emit light of a plurality of different emission wavelengths over a first wavelength range. The second LED chip includes a multi-quantum well active region having a second plurality of alternating active and barrier layers. The second plurality of active layers respectively include different relative concentrations of at least two elements of a second semiconductor compound, and are respectively configured to emit light of a plurality of different emission wavelengths over a second wavelength range including wavelengths greater than those of the first wavelength range. The light emitted by the first and second LED chips combines to provide white light. Related devices are also discussed.

30 Claims, 6 Drawing Sheets

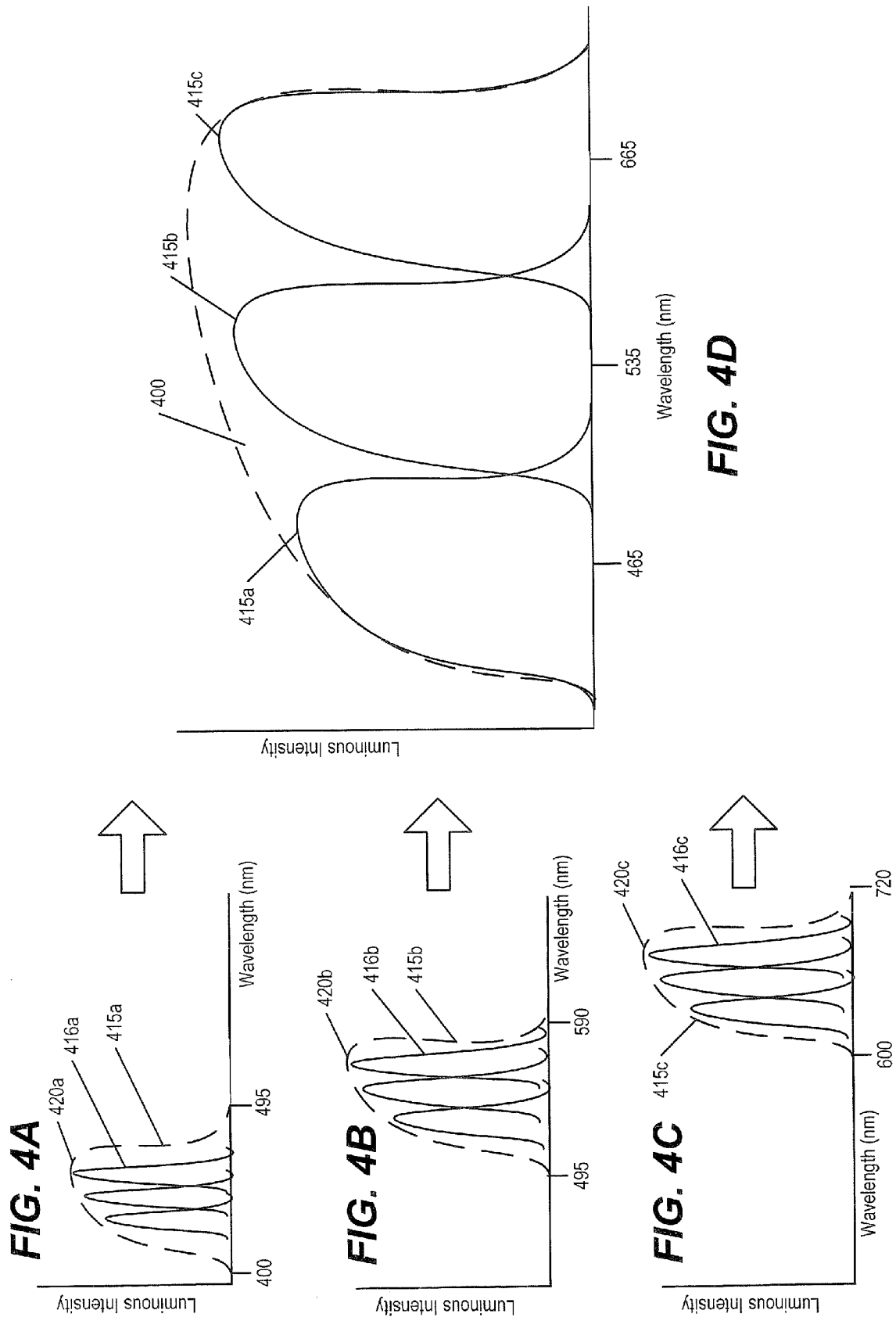

US 8,022,388 B2

BROADBAND LIGHT EMITTING DEVICE LAMPS FOR PROVIDING WHITE LIGHT OUTPUT

CROSS-REFERENCE TO RELATED PATENT APPLICATIONS

This application claims priority from U.S. Provisional Patent Application Ser. No. 61/029,093 filed Feb. 15, 2008, the disclosure of which is hereby incorporated by reference herein in its entirety.

FIELD OF THE INVENTION

The present invention relates to semiconductor light emitting devices, and more particularly, to lamps including semiconductor light emitting devices.

BACKGROUND OF THE INVENTION

Light emitting diodes and laser diodes are well known solid state lighting elements capable of generating light upon application of a sufficient current. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a current to the device, an anode contact may be formed on a p-type region of the device (typically, an exposed p-type epitaxial layer) and a cathode contact may be formed on an n-type region of the device (such as the substrate or an exposed n-type epitaxial layer). When a potential is applied to the ohmic contacts, electrons may be injected into an active region from the n-type layer and holes may be injected into the active region from the p-type layer. The radiative recombination of electrons and holes within the active region generates light. Some LED chips include an active region with multiple light emitting regions or active layers (also known as multi-quantum-well structures) between or near the junction of the n-type and p-type layers.

LEDs may be used in lighting/illumination applications, for example, as a replacement for conventional incandescent and/or fluorescent lighting. As such, it is often desirable to provide a lighting source that generates white light having a relatively high color rendering index (CRI), so that objects illuminated by the lighting may appear more natural. The color rendering index of a light source is an objective measure of the ability of the light generated by the source to accurately illuminate a broad range of colors. The color rendering index ranges from essentially zero for monochromatic sources to nearly 100 for incandescent sources. Alternatively, it may be desirable to provide a light source that may differ significantly from a light source with a high CRI index, but may still require a tailored spectrum.

In addition, the chromaticity of a particular light source may be referred to as the "color point" of the source. For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the color or hue of the white light source. White light typically has a CCT of between about 4000 and 8000K. White light with a CCT of 4000 has a yellowish color. White light with a CCT of 8000K is more bluish in color, and may be referred to as "cool white". "Warm white" may be used to describe white light with a CCT of between about 2600K and 6000K, which is more reddish in color.

The light from a single-color LED may be used to provide white light by surrounding the LED with a wavelength conversion material, such as a phosphor. The term "phosphor" may be used herein to refer to any materials that absorb light in one wavelength range and re-emit light in a different wavelength range, regardless of the delay between absorption and re-emission and regardless of the wavelengths involved. A fraction of the light may also pass through the phosphor and/or be reemitted from the phosphor at essentially the same wavelength as the incident light, experiencing little or no down-conversion. Accordingly, the term "phosphor" may be used herein to refer to materials that are sometimes called fluorescent and/or phosphorescent. In general, phosphors absorb light having shorter wavelengths and re-emit light having longer wavelengths. As such, some or all of the light emitted by the LED at a first wavelength may be absorbed by the phosphor particles, which may responsively emit light at a second wavelength.

For example, a single blue emitting LED may be surrounded with a yellow phosphor, such as cerium-doped yttrium aluminum garnet (YAG). The resulting light, which is a combination of blue light and yellow light, may appear white to an observer. More particularly, to produce yellow light, a blue photon of approximately 2.66 electron volts (eV) may be absorbed by the yellow phosphor, and a yellow photon of approximately 2.11 eV may be emitted. As such, an average energy of about 0.55 eV may be presumably lost through nonradiative processes. Thus, a blue LED surrounded by a yellow phosphor may lose an appreciable amount of energy through the conversion of blue to yellow. Also, if a red phosphor is included to improve the color rendering, the energy loss may be even greater, resulting in even greater reduced efficiency.

In addition, the light emitted by multiple different-colored LEDs may be combined to produce a desired intensity and/or color of white light. For example, when red-, green- and blue-emitting LEDs are energized simultaneously, the resulting combined light may appear white, or nearly white, depending on the relative intensities of the component red, green and blue sources. While it may be possible to achieve fairly high luminous efficacy with such lamps (due at least in part to the lack of phosphor conversion), color rendering may be poor due to the limited spectral distribution of light emitted from each LED.

SUMMARY OF THE INVENTION

A multi-chip light emitting device (LED) lamp for providing white light according to some embodiments of the invention includes first and second broadband LED chips. The first broadband LED chip includes a multi-quantum well active region including a first plurality of alternating active and barrier layers. The first plurality of active layers respectively include different relative concentrations of at least two elements of a first semiconductor compound, and are respectively configured to emit light of a plurality of different emission wavelengths over a first wavelength range. The second broadband LED chip includes a multi-quantum well active region including a second plurality of alternating active and barrier layers. The second plurality of active layers respectively include different relative concentrations of at least two elements of a second semiconductor compound, and are respectively configured to emit light of a plurality of different emission wavelengths over a second wavelength range that includes wavelengths greater than those of the first wavelength range.

In some embodiments, a spectral distribution of the light emitted by at least one of the first and second broadband LED chips may have a full width at half maximum (FWHM) of greater than about 35 nanometers (nm).

In other embodiments, the light emitted by the first broadband LED chip may define a first spectral distribution over the first wavelength range, and the light emitted by the second broadband LED chip may define a second spectral distribution over the second wavelength range. A separation between respective center wavelengths of the first and second spectral distributions may not be greater than a sum of respective half width at half maximum values of the first and second spectral distributions.

In some embodiments, the lamp may further include a third broadband LED chip. The third broadband LED chip may include a multi-quantum well active region including a third plurality of alternating active and barrier layers. The third plurality of active layers may respectively include different relative concentrations of at least two elements of a third semiconductor compound, and may be respectively configured to emit light of a plurality of different emission wavelengths over a third wavelength range that includes wavelengths greater than those of the second wavelength range. The third semiconductor compound may emit light with a third spectral distribution and the light emitted by the first, second, and third LED chips may combine to provide the appearance of white light.

In other embodiments, the light emitted by the first broadband LED chip may define a first spectral distribution over the first wavelength range, the light emitted by the second broadband LED chip may define a second spectral distribution over the second wavelength range, and the light emitted by the third broadband LED chip defines a third spectral distribution over the third wavelength range. A separation between respective center wavelengths of the first and second spectral distributions may not be greater than a sum of respective half width at half maximum values of the first and second spectral distributions. A separation between respective center wavelengths of the second and third spectral distributions may not be greater than a sum of respective half width at half maximum values of the second and third spectral distributions.

In some embodiments, the light emitted by the first broadband LED chip may define a first spectral distribution over the first wavelength range, and the light emitted by the second broadband LED chip may define a second spectral distribution over the second wavelength range. A separation between respective center wavelengths of the first and second spectral distributions may not be less than a sum of respective half width at half maximum values of the first and second spectral distributions.

In other embodiments, the lamp may further include a light conversion material configured to absorb at least some of the light emitted by the first and/or second LED chips and re-emit light of a plurality of different emission wavelengths over a third wavelength range between the first and second wavelength ranges. As such, the light emitted by the first and second LED chips and the light conversion material may combine to provide the white light.

According to other embodiments of the present invention, a multi-chip light emitting device (LED) lamp for providing white light includes blue, green, and red broadband LED chips. The blue broadband LED chip includes a multi-quantum well active region comprising a first plurality of alternating active and barrier layers, the first plurality of active layers respectively including different relative concentrations of at least two elements of a first semiconductor compound and respectively configured to emit light of a plurality of different emission wavelengths over a blue wavelength range. The green broadband LED chip includes a multi-quantum well active region including a second plurality of alternating active and barrier layers, the second plurality of active layers respectively including different relative concentrations of at least two elements of a second semiconductor compound and respectively configured to emit light of a plurality of different emission wavelengths over a green wavelength range. The red broadband LED chip includes a multi-quantum well active region including a third plurality of alternating active and barrier layers, the third plurality of active layers respectively including different relative concentrations of at least two elements of a third semiconductor compound and respectively configured to emit light of a plurality of different emission wavelengths over a red wavelength range. The third semiconductor compound has a narrower bandgap than the second semiconductor compound, and the second semiconductor compound has a narrower bandgap than the first semiconductor compound. The light emitted by the blue, green, and red broadband LED chips combines to provide an appearance of white light with good color rendering.

According to further embodiments of the present invention, a multi-chip light emitting device (LED) lamp for providing white light includes blue and red broadband LED chips and a light conversion material. The blue broadband LED chip includes a multi-quantum well active region including a first plurality of alternating active and barrier layers. The first plurality of active layers respectively include different relative concentrations of at least two elements of a first semiconductor compound and are respectively configured to emit light of a plurality of different emission wavelengths over a blue wavelength range. The red broadband LED chip includes a multi-quantum well active region including a second plurality of alternating active and barrier layers. The second plurality of active layers respectively include different relative concentrations of at least two elements of a second semiconductor compound and are respectively configured to emit light of a plurality of different emission wavelengths over a red wavelength range. The light conversion material is configured to absorb at least some of the light emitted by the blue and/or red LED chips and re-emit light over a green wavelength range. The second semiconductor compound has a narrower bandgap than the first semiconductor compound. The light emitted by the blue and red LED chips and the light conversion material combines to provide an appearance of white light.

BRIEF DESCRIPTION OF THE DRAWINGS

FIGS. 4A-4D are graphs illustrating example spectral emission characteristics of light emitting device lamps according to some embodiments of the present invention.

DETAILED DESCRIPTION OF EMBODIMENTS OF THE INVENTION

Figure 1A:
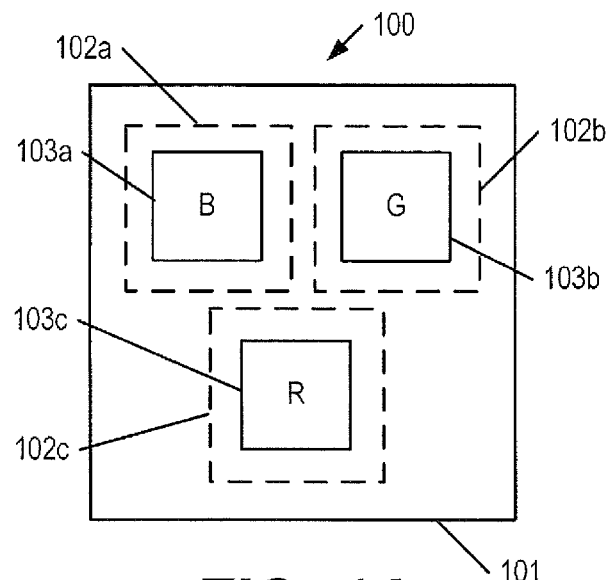
FIG. 1A is a top view illustrating a LED lamp according to some embodiments of the present invention.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will also be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, the term "semiconductor light emitting device" and/or "LED" may include a light emitting diode, laser diode and/or other semiconductor device which includes one or more semiconductor layers, which may include silicon, silicon carbide, nitride compounds, and/or other semiconductor materials. Examples of nitride compounds may include GaN, AlN, InN, $Al_{0.1}Ga_{0.9}N$, $Al_{0.2}In_{0.1}Ga_{0.7}N$ and $In_{0.1}Ga_{0.9}N$. More generally, the notation (Al, In, Ga)N is used hereinafter to refer to a nitride compound $Al_xIn_yGa_{1-x-y}N$, where $0 \leq x \leq 1$, $0 \leq y \leq 1$, and $x+y \leq 1$. A light emitting device may or may not include a substrate such as a sapphire, silicon, silicon carbide, germanium, gallium nitride and/or another microelectronic substrates. A light emitting device may include one or more contact layers which may include metal and/or other conductive layers. In some embodiments, ultraviolet, blue, cyan, green, amber, and/or red LEDs may be provided. The design and fabrication of semiconductor light emitting devices are well known to those having skill in the art and need not be described in detail herein.

As used herein, the term "full width at half maximum" may refer to the width (in nanometers) of a spectral distribution at about half of its maximum value. Likewise, as used herein, the term "half width at half maximum" may refer to a value corresponding to half of the width (in nanometers) of a distribution at half of its maximum value.

Some embodiments of the present invention may arise from a realization that, in conventional LED lamps including red, green, and blue LEDs, the spectral power distributions of the component LEDs may be relatively narrow. Commercial LEDs typically have a narrow full width at half maximum (FWHM): red LEDs may have a FWHM of 17-18 nm, yellow LEDs may have a FWHM of 12-15 nm, blue LEDs may have a FWHM of 18-20 nm, and green LEDs may have a FWHM of 35-36 nm. The larger than typical FWHM found in the commercial green LED may be a consequence of the difficulties arising from controlling quantity and agglomeration of indium (In) in the green LED quantum wells. Because of the narrow spectral width of these LEDs, objects illuminated by such light may not appear to have natural coloring due to the limited spectrum of the light, even when multiple colors such as red, green and blue are employed.

Accordingly, some embodiments of the present invention provide LED lamps including a plurality of "broadband" LED chips (also referred to herein as "broadband LEDs") having respective spectral outputs of greater than about 20 nm over red, blue, violet, yellow and amber wavelength ranges, and spectral outputs of greater than about 35 nm over the green wavelength range. More specifically, some embodiments of the present invention provide LED lamps including three broadband LED chips having tailored spectral outputs to provide improved color rendering. In some embodiments, one or more of the broadband LED chips may have a spectral distribution with a full width at half maximum (FWHM) of greater than about 35 nanometers (nm). The materials and/or stoichiometries of the broadband LEDs may be selected to provide white light output that is comparable in brightness, performance, CRI and/or overall spectral distribution to that of conventional light sources such as incandescent bulbs, with greater energy efficiency.

FIG. 1A illustrates an LED lamp according to some embodiments of the present invention. Referring now to FIG. 1A, a multi-chip LED lamp 100 includes a common substrate or submount 101 including first, second, and third die mounting regions 102a, 102b, and 102c. The die mounting regions 102a, 102b, and 102c are each configured to accept a broadband LED chip. As used herein, a "broadband LED" or "broadband LED chip" refers to an LED chip configured to emit light with a spectral width that is broad compared to a conventional LED, i.e., greater than about 30-35 nm for green LEDs and greater than about 20 nm for red, blue, violet, yellow, amber, and other colored LEDs. For example, the red or blue or amber LED may emit with a spectral distribution that is centered or has a central wavelength on red or blue or amber (respectively), but the respective spectral distributions may have a full width at half maximum of 20 nm or 25 nm or 30 nm or 40 nm or 50 nm or 75 nm or greater. Similarly, the green LED may emit with a spectral distribution that has a full width centered on green, but with a full width at half maximum of 35 nm or 40 nm or 50 nm or 75 nm or greater. The light emitted by a broadband LED may have a spectral shape that differs appreciably from a Gaussian-like peak shape typically observed in the light output of conventional LEDs. The spectrum may, for example, have a "top-hat" or substantially uniform distribution, a LaPlace-shaped distribution, a bimodal distribution, a sawtooth distribution, a multimodal distribution, and/or a distribution that is composite of more than one of these distributions (including the Gaussian). In some embodiments of the present invention, a broadband LED may be configured to emit light over a wavelength range of greater than about 50 nm. In other embodiments, a broadband LED may be configured to emit light over a wavelength range of greater than about 75-100 nm.

Still referring to FIG. 1A, first, second, and third broadband LED chips 103a, 103b, and 103c are mounted on the die mounting regions 102a, 102b, and 102c of the submount 101, respectively. For example, the first broadband LED chip 103a may be a blue LED chip configured to emit light in a blue wavelength range (i.e., between about 410-495 nm), the second LED chip 103b may be a green LED chip configured to emit light in a green wavelength range (i.e., between about 495-590 nm), and the third LED chip 103c may be a red LED chip configured to emit light in a red wavelength range (i.e., between about 600-720 nm). As such, the light emitted by the first, second, and third broadband LED chips 103a, 103b, and 103c combines to provide white light. The first, second, and third broadband LED chips 103a, 103b, and 103c may be formed of different materials that are selected to provide relatively high-CRI white light output at a relatively high efficiency. For example, the green LED chip 103b may be formed of a semiconductor compound having a narrower bandgap than that of the semiconductor compound used in the blue LED chip 103a, and the red LED chip 103c may be formed of a semiconductor compound having a narrower bandgap than that of the semiconductor compound used in the green LED chip 103b. In addition, it should be noted that the LED lamp 100 does not include a light conversion material, such as a phosphor. Accordingly, because no phosphor is used, the LED lamp 100 may not involve energy losses associated with absorption, remission, and/or nonradiative recombination.

Although described above with reference to particular colors of light emitted by the LED chips 103a, 103b, and 103c, it is to be understood that other combinations of different-colored broadband LED chips may be used to provide the white light output. For example, in some embodiments, the LED chips 103a, 103b, and 103c may be cyan, yellow, and magenta LED chips.

Figure 1C:
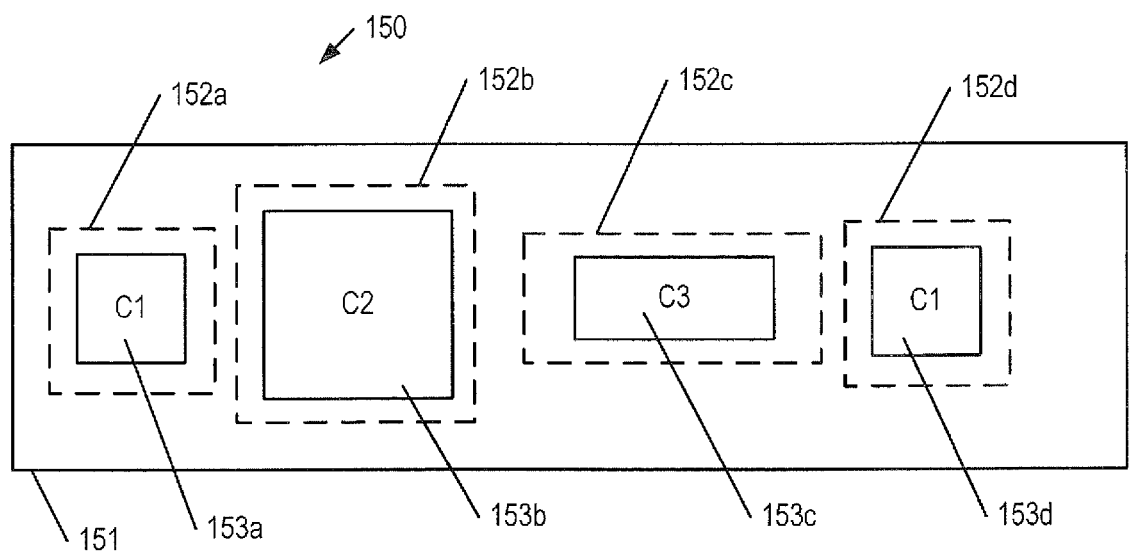
FIG. 1C is a plan view illustrating an LED lamp according to other embodiments of the present invention.
Figure 1B:
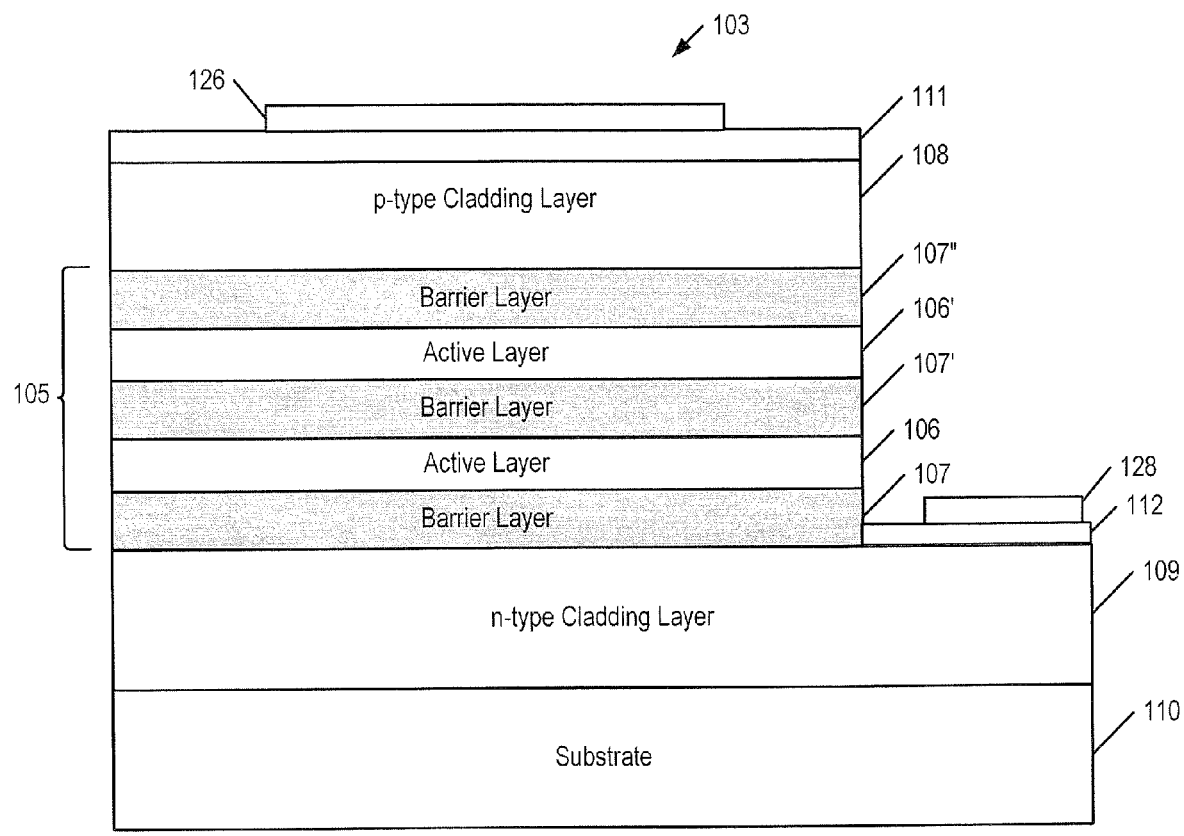
FIG. 1B is a cross-sectional view illustrating a LED chip for use in LED lamps according to some embodiments of the present invention.

FIG. 1B is a cross-sectional view illustrating a broadband LED chip according to some embodiments of the present invention. As shown in FIG. 1B, the LED chip 103 includes an active region 105 sandwiched between a p-type cladding layer 108 and an n-type cladding layer 109. The LED chip 103 also includes a p-type contact layer 111 on the p-type cladding layer 108, and an n-type contact layer 112 on the n-type cladding layer 109. The contact layers 111 and/or 112 may be a doped semiconductor that is distinct from the cladding layer, which may act to spread charge before the cladding layer. The active region 105 is a multi-quantum well structure including a plurality of alternating active layers 106 and 106' and barrier layers 107, 107', and 107'. The active layers 106 and 106' each include different stoichiometries or relative concentrations of the elements of a semiconductor compound, and as such, are each configured to emit light of different emission wavelengths over a selected wavelength range. For example, where the LED chip 103 is a blue LED chip, the active layers 106 and 106' may be gallium nitride (GaN) layers, and each layer may include different concentrations of gallium and/or nitride configured to emit light at different wavelengths over a blue wavelength range (e.g., about 410-510 nm). Similarly, where the LED chip 103 is a green LED chip, the active layers 106 and 106' may be indium gallium nitride (InGaN) layers, each including different concentrations of indium, gallium, and/or nitride configured to emit light at different wavelengths over a green wavelength range (e.g., about 495-590 nm). Likewise, where the LED chip 103 is a red LED chip, the active layers 106 and 106' may be aluminum gallium indium phosphide (AlGaInP) layers, each including different concentrations of aluminum, gallium, indium, and/or phosphide configured to emit light at different wavelengths over a red wavelength range (e.g., about 600-720 nm). Additionally or alternatively, the active layers 106 and 106' may be formed to different thicknesses to provide the emission wavelengths in the desired wavelength range.

Accordingly, the active layers 106 and 106' may have different thicknesses and/or compositions selected to define a plurality of different bandgap energies. The stoichiometry may change not only layer-to-layer, but also within a particular layer. As such, when a potential is applied to ohmic contacts 126 and 128, the radiative recombination of electrons and holes in each of the active layers 106 and 106' provides light emission at different wavelengths. In other words, the stoichiometries and/or widths of the layers 106a and 106a' may be adjusted to achieve a desired spectral output. The LED chip 103 may further include a substrate 110, one or more capping layers (not shown) between the cladding layers 108 and 109 and the contacts and 126 and 128, and/or one or more confinement layers (not shown) between the last quantum well layers 107" and 107 of the multi-quantum well active region 105 and the cladding layers 108 and/or 109. For example, each confinement layer may have a uniform or graded semiconductor alloy composition configured to provide a transition between that of the adjacent cladding layer and the active region 105. In some embodiments, the confinement layers may provide bandgap energies between that of the cladding layers 109 and 108 and barrier layers 107 and 107", respectively, for confining carriers (i.e., electrons and holes) to promote more efficient recombination within the active region 105. Also, the stoichiometries of the cladding layers 108 and/or 109 may be altered to reduce differences in bandgap energies between the adjacent barrier layers 107" and 107.

Although illustrated in FIG. 1B with reference to particular numbers of layers in the active region 105, it is to be understood that the number of layers, thicknesses, and/or compositions of the layers of the active region 105 may be altered for different applications. For example, although illustrated as including only two active layers 106 and 106', it is to be understood that broadband LED chips according to some embodiments of the present invention may include additional active layers having similar and/or different stoichiometries, and the number, thickness, and/or compositions of these layers may be selected to provide a desired spectral output. In other words, the spectral output of the broadband LEDs may be tuned by adjusting the properties of the quantum wells of the active region 105. Because of the width of the spectral output of each broadband LED may be about 100 nm or less, the variations in stoichiometry may be manufactured with relatively high efficiency. Further, it is to be understood that the barrier layers 107 and/or 107" may be incorporated into the adjacent cladding layers 109 and/or 108, respectively, in some embodiments.

FIG. 1C illustrates an LED lamp according to other embodiments of the present invention and illustrates some ways in which the LEDs in the lamp may be changed to facilitate the formation of the desired light spectral distribution. In particular, FIG. 1C shows that an LED lamp including broadband LEDs according to some embodiments of the present invention may use more than one LED of a particular color, may use LED chips that differ in size, and/or may use LED chips having different shapes. Referring now to FIG. 1C, a multi-chip LED lamp 150 includes a common substrate or submount 151 including first, second, third and fourth die mounting regions 152a, 152b, 152c and 152d. The die mounting regions 152a, 152b, 152c and 152d are each configured to accept a broadband LED chip.

Still referring to FIG. 1C, first, second, third and fourth broadband LED chips 153a, 153b, 153c and 153d are mounted on the die mounting regions 152a, 152b, 152c and 152d of the submount 151, respectively. For example, the first and the first broadband LED chip 153a may emit light in a substantially similar color range (C1) as a second LED chip 153d (C1). A third LED chip 153c may be larger or smaller than other chips to emit a different amount and/or character of light (C2). A fourth chip LED chip 153c may be shaped differently to emit a third color intensity and/or character of light(C3). It is to be understood that combinations of the three colors C1, C2 and C3 of light may be combined to provide white light or another desired color distribution.

Figure 2A:
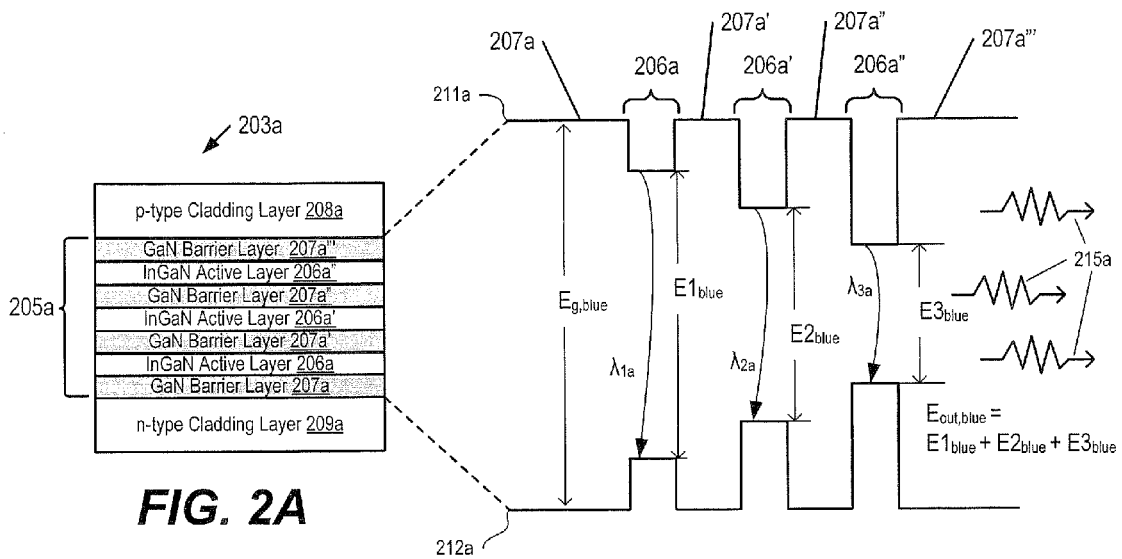
FIGS. 2A-2C are cross-sectional views and corresponding energy diagrams illustrating multi-quantum well structures in LED lamps according to some embodiments of the present invention.
Figure 2B:
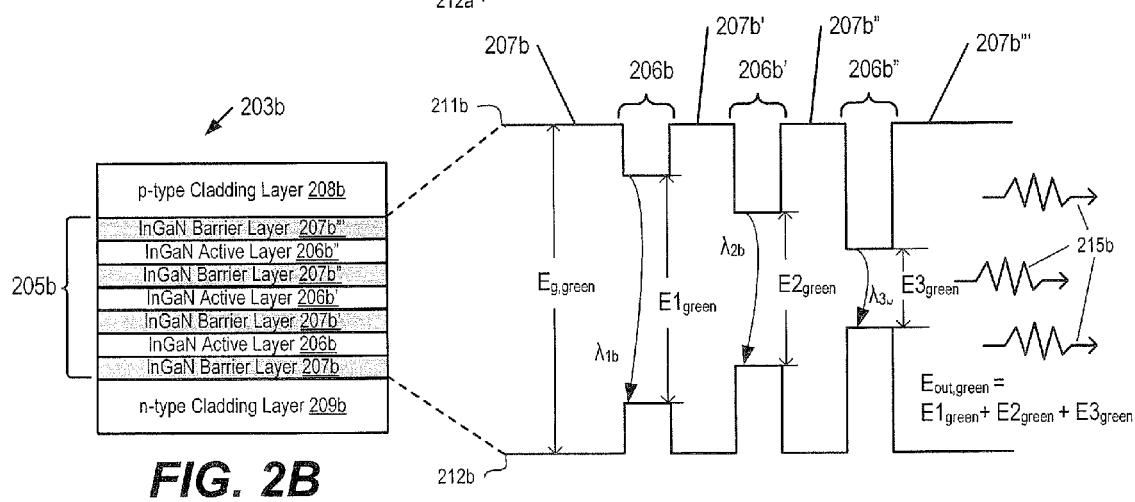
Figure 2C:
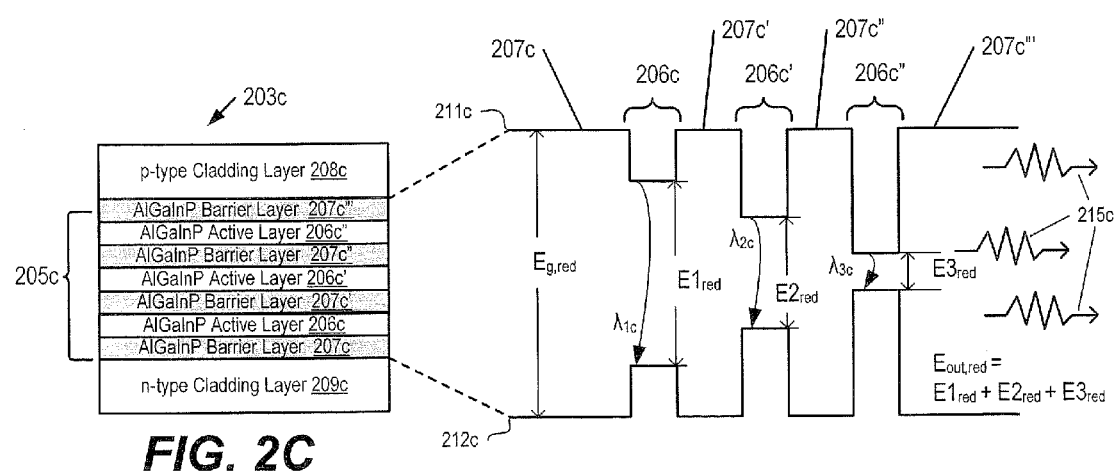

FIGS. 2A-2C illustrate broadband LED chips and corresponding energy band diagrams according to some embodiments of the present invention. Referring now to FIG. 2A, a first LED chip 203a includes an indium gallium nitride (InGaN) based active region 205a provided between a p-type cladding layer 208a and n-type cladding layer 209a. The InGaN-based active region 205a is a multi-quantum well structure including a plurality of alternating active layers 206a, 206a', and 206a" and barrier layers 207a, 207a', 207a", and 207a'". In some embodiments, the LED chip 203a may correspond to the LED chip 103a of FIG. 1A.

The active layers 206a, 206a', and 206a" each include different relative concentrations of indium (In) and gallium (Ga) selected to provide a broadband blue LED. For example, the active layer 206 may comprise $In_xGa_{1-x}N$, where the average indium concentration x may be in the range $0.12 \leq x \leq 0.19$, corresponding to light from about 440 nm to 500 nm. More particularly, the active layer 206a may comprise $In_xGa_{1-x}N$ in which the average indium concentration x is about 0.13, the active layer 206a' may comprise $In_yGa_{1-y}N$, in which the average indium concentration y is about 0.15, and the active layer 206a" may comprise $Ga_zN_{1-z}$, in which the average indium concentration z is about 0.17. The indium gallium nitride active layers 206a, 206a', and 206a" may have equal and/or different thicknesses, for example, between about 1 nm and 100 nm. In some embodiments, the indium and/or gallium concentration may also be varied over the thickness of one or more of the active layers 206a, 206a', and 206a" to provide stepwise and/or continuous grading within one or more layers. The relative concentrations and/or thicknesses of the indium gallium nitride active layers 206a, 206a', and 206a" are selected such that the LED chip 203a emits light of a plurality of different wavelengths over a blue wavelength range (e.g., about 440 nm to about 500 nm). It is to be understood that the indium concentrations provided in the above example are approximate and illustrative, and as such, may be adjusted in each of the quantum wells to obtain a desired concentration.

More particularly, as illustrated in the energy band diagram of FIG. 2A, the multi-quantum well structure 205a of the LED chip 203a includes InGaN active quantum well layers 206a, 206a', and 206a" of varying stoichiometries. The energy levels of the conduction band edge 211a and valence band edge 212a are shown schematically; the levels are associated with the material used to produce the barrier layers 207a, 207a', 207a", and 207a'". For the broadband blue LED 203a, the barrier layers 207a, 207a', 207a", and 207a'" are formed from GaN. The relative concentrations of indium and gallium in the quantum well active layers 206a, 206a', and 206a" are selected to define a plurality of different bandgap energies. As such, electrons and holes in the quantum wells active layers 206a, 206a', and 206a" recombine and emit light with energy consistent with the different bandgaps defined by the quantum wells 206a, 206a', and 206a" ($E1_{blue}$, $E2_{blue}$, $E3_{blue}$, respectively). The different bandgaps provides light at different average emission wavelengths $\lambda_{1a}$, $\lambda_{2a}$, and $\lambda_{3a}$ within the blue wavelength range, which additively combine to provide an integrated, broadband blue output light 215a. The relative concentrations of indium and gallium in the quantum well layers 206a, 206a', and 206a" may be selected to provide the output light 215a over a wavelength range of greater than about 30 nm with a center wavelength of about 465 nm. It is to be understood that, while a particular quantum well active layer may be formed with a target indium concentration to emit light at a target emission wavelength, the indium in the quantum well is not homogeneous, and as such, there may be some variation in the bandgap and hence the energy of the emitted light. Further, other physical processes such as thermal smearing, scattering, etc. may cause light to be emitted at not only the target wavelength, but also at wavelengths near the target wavelength.

The nonradiative energy loss $E_{loss\ blue}$ associated with producing the output light 215a is represented by the difference between the input energy $E_{g,\ blue}$ (defined by the energy required to raise electrons from the valence band 212a into the conduction band 211a) and the output energy $E_{out,\ blue}$.

$E_{out, blue}$ is a function of the bandgap energies $E1_{blue}$, $E2_{blue}$, and $E3_{blue}$, and in some cases may be an average. For example, a broadband blue LED chip 203a, formed from a base semiconductor material GaN (bandgap approximately 3.65 eV), according to some embodiments of the present invention, may have a nonradiative energy loss $E_{loss, blue}$ of about 0.65 eV to about 1.0 eV when the bandgap of the quantum wells ranges from about 3.0 eV to about 2.65 eV. The LED may also possess additional layers or device elements/structures, not shown in the LED schematic of FIG. 2A, that may lead to additional energy loss beyond the nonradiative energy loss $E_{loss, blue}$ defined above.

Still referring to FIG. 2A, the GaN barrier layers 207a, 207a', 207a", and 207a'" have (Al, In, Ga)N compositions selected to provide larger bandgaps than the active layers 206a, 206a', and 206a". Although illustrated as each including the same relative concentrations of (Al, In, Ga)N, one or more of the barrier layers 207a, 207a', 207a", and 207a'" may be provided with different stoichiometries in some embodiments, as will be discussed in detail below with reference to FIG. 3A. In addition, although illustrated in FIG. 2A as having stoichiometries selected to provide sequentially decreasing bandgap energies (for example, for ease in fabrication), other stoichiometries may also be used for the active layers, or even within one or more of the active layers.

Referring now to FIG. 2B, a second LED chip 203b includes an indium gallium nitride (InGaN) based active region 205b provided between a p-type cladding layer 208b and n-type cladding layer 209b. The active region 205b is a multi-quantum well structure including a plurality of alternating InGaN active layers 206b, 206b', and 206b" and barrier layers 207b, 207b', 207b", and 207b'". Accordingly, the InGaN-based active region 205b has a narrower bandgap than the InGaN-based active region 205a of the first LED chip 203a. In some embodiments, the LED chip 203b may correspond to the LED chip 103b of FIG. 1A.

The active layers 206b, 206b', and 206b" each include different relative concentrations of indium and gallium selected to provide a broadband green LED. For example, the active layer 206b may comprise $In_xGa_{1-x}N$, where the average indium concentration x is about 0.20, the active layer 206a' may comprise $In_yGa_{1-y}N$, where the average indium concentration y is about 0.22, and the active layer 206a" may comprise $In_zGa_{1-z}N$, where the average indium concentration z is about 0.26. As such, the target average wavelength for active layer 206b is about 515 nm, the target average wavelength for active layer 206a' is about 540 nm and the target average wavelength for active layer 206a" is about 565 nm. The InGaN active layers 206b, 206a', and 206a" may have equal and/or different thicknesses, for example, between about 1 nm and 100 nm. In some embodiments, the indium and gallium concentration may be varied over the thickness of one or more of the active layers 206b, 206a', and 206a" to provide stepwise and/or continuous grading within one or more layers. The relative concentrations and/or thicknesses of the InGaN active layers 206b, 206a', and 206a" are selected such that the LED chip 203b emits light of a plurality of different wavelengths over a green wavelength range (e.g., about 495 nm to about 590 nm). It is to be understood that the indium concentrations provided in the above example are approximate and illustrative, and as such, may be adjusted in each of the quantum wells to obtain a desired concentration and/or emission characteristics.

More particularly, as illustrated in the energy band diagram of FIG. 2B, the multi-quantum well structure 205b of the LED chip 203b includes InGaN active quantum well layers 206b, 206a', and 206a" of varying stoichiometries selected to define a plurality of different bandgap energies, such that the energy of the recombination across the different quantum well layers 206b, 206a', and 206a" ($E1_{green}$, $E2_{green}$, $E3_{green}$, respectively) provides light at different average emission wavelengths $\lambda_{1b}$, $\lambda_{2b}$, and $\lambda_{3b}$ within the green wavelength range. The different emission wavelengths $\lambda_{1b}$, $\lambda_{2b}$, and $\lambda_{3b}$ additively combine to provide an integrated broadband green output light 215b. The relative concentrations of indium and gallium in the quantum well layers 206b, 206a', and 206a" may be selected to provide the output light 215b over a wavelength range of greater than about 30 nm, with a center wavelength of about 540 nm.

The nonradiative energy loss $E_{loss\ green}$ associated with producing the output light 215b is represented by the difference between the input energy $E_{g, green}$ (which may be defined by the minimum energy required to raise an electron from the valence band 212b into the conduction band 211b) and the output photon energy $E_{out, green}$. $E_{out, green}$ is a function of the bandgap energies $E1_{green}$, $E2_{green}$ and $E3_{green}$ (referred to collectively as $E_{out, green}$). The nonradiative energy loss for green emission is given by $E_{loss, green} \approx E_{g, green} - E_{out, green}$ (because of system effects, such as heating, the two sides of the equation may be approximately equal ($\approx$)). For example, the nonradiative energy loss of a broadband green LED chip 203b, formed from a base semiconductor material GaN (having a bandgap of approximately 3.65 eV), according to some embodiments of the present invention, will be about 0.95 eV to about 1.20 eV when the bandgap of the quantum wells ranges from 2.40 eV to 2.90 eV. When the green broadband LED 203b is formed from InGaN base material, instead of GaN or AlGaN, the overall nonradiative energy loss $E_{loss, green}$ may be reduced relative to the overall nonradiative energy loss $E_{loss, blue}$ of the blue broadband LED 203a. In other words, the nonradiative energy loss $E_{loss, green}$ may be reduced by selecting a narrower-bandgap base material for the green LED chip 205b to reduce the difference between the input and output energies. For example, if the LED is formed from a base material of $In_{0.12}Ga_{0.88}N$ (having a bandgap of approximately 2.81 eV), the non radiative energy loss is approximately 0.41 eV to 0.62 eV for light emitter between 515 nm and 565 nm. It should be noted that, while light emitted from a quantum well is referred to herein as having a specific, characteristic energy, such as $E1_{green}$ or $E3_{blue}$, this energy is an average energy, and thus the light emitted from each quantum well may have a distribution of energies scattered about the average value. The range of emission energies may arise from thermal broadening and/or from variations in the well stoichiometries. Accordingly, greater energy efficiency may be achieved by using a narrower bandgap base material and/or stoichiometries for the active layers 206b, 206a', and 206a" of the second LED chip 203b than those of the first LED chip 203a.

Still referring to FIG. 2B, the InGaN barrier layers 207b, 207b', 207b", and 207b'" have indium and gallium compositions selected to provide larger bandgaps than the active layers 206b, 206a', and 206a". Although illustrated as including the same relative concentrations of indium and gallium in FIG. 2B, one or more barrier layers 207b, 204b', 207b", and 207b'" may be provided with different relative compositions of indium and gallium in some embodiments, as will be discussed in detail below with reference to FIG. 3B. Further, the stoichiometry in each layer may vary. Also, although illustrated as having stoichiometries to provide InGaN active layers 206b, 206a', and 206a" of sequentially decreasing bandgap energies, other elements and/or stoichiometries may also be used for the active layers.

Referring now to FIG. 2C, a third LED chip 203c includes an aluminum gallium indium phosphide (AlGaInP) based active region 205c provided between a p-type cladding layer 208c and n-type cladding layer 209c. The AlGaInP based active region 205c is a multi-quantum well structure including a plurality of alternating AlGaInP active layers 206c, 206c', and 206c'' and barrier layers 207c, 207c', 207c'', and 207c'''. Accordingly, the AlGaInP based active region 205c has a narrower bandgap than the InGaN based active region 205b of the second LED chip 203b. In some embodiments, the LED chip 203c may correspond to the LED chip 103c of FIG. 1A.

The active layers 206c, 206c', and 206c'' each include different relative concentrations of aluminum, gallium, and/or indium configured to provide a broadband red LED. For example, the active layer 206c may comprise $Al_xGa_yIn_{1-x-y}P$, targeting an average emission wavelength of about 625 nm. The active layer 206c' may comprise $Al_wGa_zIn_{1-w-z}P$, targeting an average emission wavelength of about 650 nm. The active layer 206c'' may comprise $Al_uGa_vIn_{1-u-v}P$, targeting an average emission wavelength of about 680 nm. The AlGaInP active layers 206c, 206c', and 206c'' may have equal and/or different thicknesses, for example, between about 1 nm and 100 nm. In some embodiments, the aluminum, gallium, and/or indium, concentrations may be varied over the thickness of one or more of the active layers 206c, 206c', and 206c'' to provide stepwise and/or continuous grading within one or more layers. The relative concentrations and/or thicknesses of the AlGaInP active layers 206c, 206c', and 206c'' are selected such that the LED chip 203c emits light of a plurality of different wavelengths over a red wavelength range (e.g., about 600 nm to about 720 nm).

More particularly, as illustrated in the energy band diagram of FIG. 2C, the multi-quantum well structure 205c of the LED chip 203c includes AlGaInP active quantum well layers 206c, 206c', and 206c'' of varying stoichiometries selected to define a plurality of different average bandgap energies, such that the energy of the recombination across the different bandgaps provides light at different average emission wavelengths $\lambda_{1c}$, $\lambda_{2c}$, and $\lambda_{3c}$ within the red wavelength range. The different average emission wavelengths $\lambda_{1c}$, $\lambda_{2c}$, and $\lambda_{3c}$ additively combine to provide an integrated broadband red output light 215c. The relative concentrations of aluminum, gallium, and indium in the quantum well layers 206c, 206c', and 206c'', as well as well dimensions may be selected to provide the output light 215c over a wavelength range of greater than about 30 nm with a center wavelength of about 665 nm.

The nonradiative energy loss $E_{loss, red}$ associated with producing the output light 215c is represented by the difference between the input energy $E_{g, red}$ (defined by the energy of the AlGaInP barrier region 207c) and the photon energies consistent with the multi-quantum well structures with average band gap energies $E1_{red}$, $E2_{red}$ and $E3_{red}$ (referred to collectively as $E_{out, red}$). As noted above, the wavelength of an emitted photon is inversely proportional to the bandgap energy. Thus, the output energy for producing light in the red wavelength range $E_{out, red}$ is less than the output energy for producing light in the green and blue wavelength ranges $E_{out, green}$ and $E_{out, blue}$. However, because the bandgap energy $E_{g, red}$ of AlGaInP is narrower than the bandgap energies $E_{out, green}$ and $E_{out, blue}$ formed, for example, with GaN and InGaN, respectively, the overall nonradiative energy loss $E_{loss, red}$ may be reduced. In other words, by selecting a narrower-bandgap material for the red LED chip active region 205c than that of the green LED chip active region 205b, the difference between the input and output energies may be reduced, thereby reducing the nonradiative energy loss $E_{loss, red}$. Accordingly, improved energy efficiency may be achieved by using different base materials having increasingly narrower bandgaps in broadband LED chips that emit higher wavelength light.

Still referring to FIG. 2C, the AlGaInP barrier layers 207c, 207c', 207c'', and 207c''' have aluminum, gallium, and indium compositions selected to provide larger bandgaps than the active layers 206c, 206c', and 206c''. Also, although illustrated in FIG. 2C as including the same relative concentrations of aluminum, gallium, and indium, one or more barrier layers 207c, 207c', 207c'', and 207c''' may be provided with different relative compositions of aluminum, gallium, and/or indium in some embodiments, as will be discussed in detail below with reference to FIG. 3C. In addition, although illustrated as having stoichiometries selected to provide sequentially decreasing bandgap energies, other stoichiometries may also be used for the AlGaInP active layers.

Accordingly, the number, width, depth (based on stoichiometry), separation, doping, shape, and/or semiconductor material of one or more of the wells shown in FIGS. 2A-2C may be modified to achieve a desired spectral output. For example, the quantum well width may be modified by adjusting the quantum well growth time, changing the growth temperature, and/or adjusting the partial pressures of the chamber gases to select average emission color or improve spectral distribution and/or alter efficiency. The well stoichiometries may also be adjusted by changing the gas partial pressures and/or other growth parameters. Changes such as these may be made during growth of the quantum well to produce wells with nonuniform shape (i.e., varying stoichiometries). In addition, the sequence in which the quantum wells are formed may be selected based on the requirements of the structure being grown. For example, a structure in including quantum wells having highly different stoichiometries may be grown such that the concentration of a particular element is sequentially increased in adjacent wells to provide quantum wells of sequentially decreasing bandgaps, which may increase and/or maximize efficiency and/or reduce reabsorption.

In addition, although illustrated in FIGS. 2A-2C as included in three separate chips 203a, 203b, and 203c, it is to be understood that the GaN, InGaN, and/or AlGaInP multi-quantum well active regions 205a, 205b, and/or 205c may be formed on a common substrate. For example, a GaN-based multi-quantum well structure, an InGaN-based multi-quantum well structure, and an AlGaInP-based multi-quantum well structure may be formed on a single substrate, and may respectively emit light over blue, green, and red wavelength ranges such that the combination is perceived as white light.

Figure 3A:
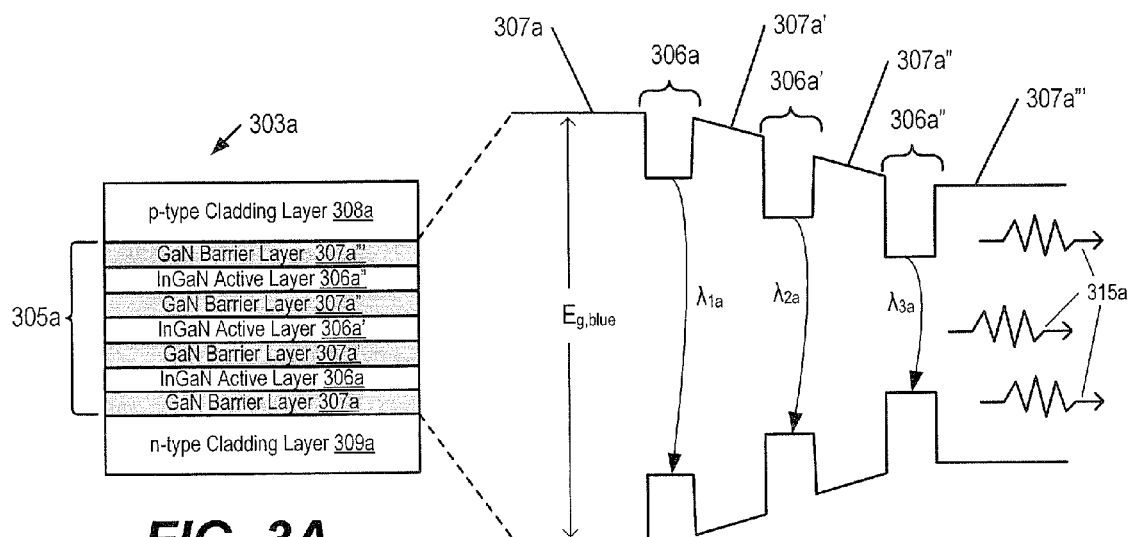
FIGS. 3A-3C are cross-sectional views and corresponding energy diagrams illustrating multi-quantum well structures in LED lamps according to other embodiments of the present invention.
Figure 3B:
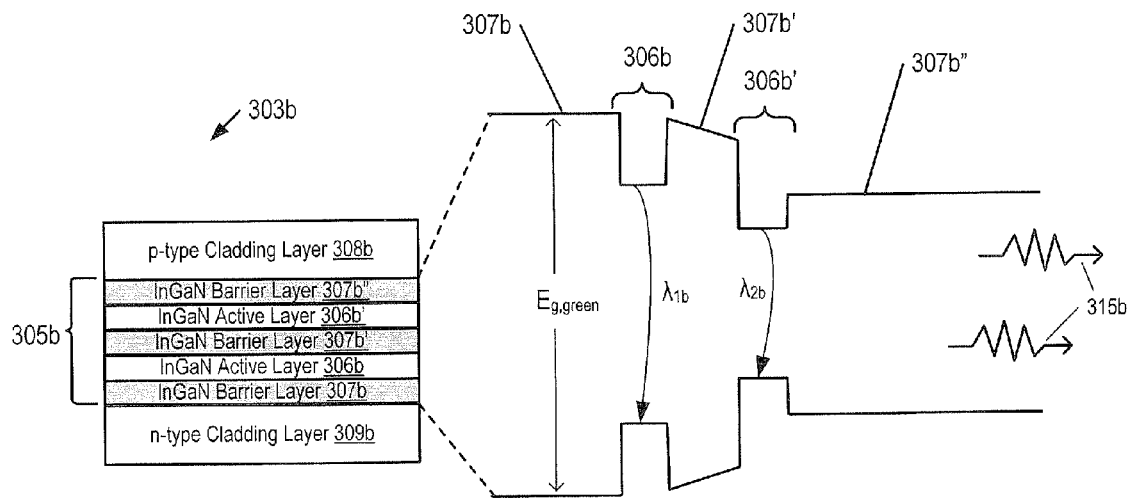
Figure 3C:
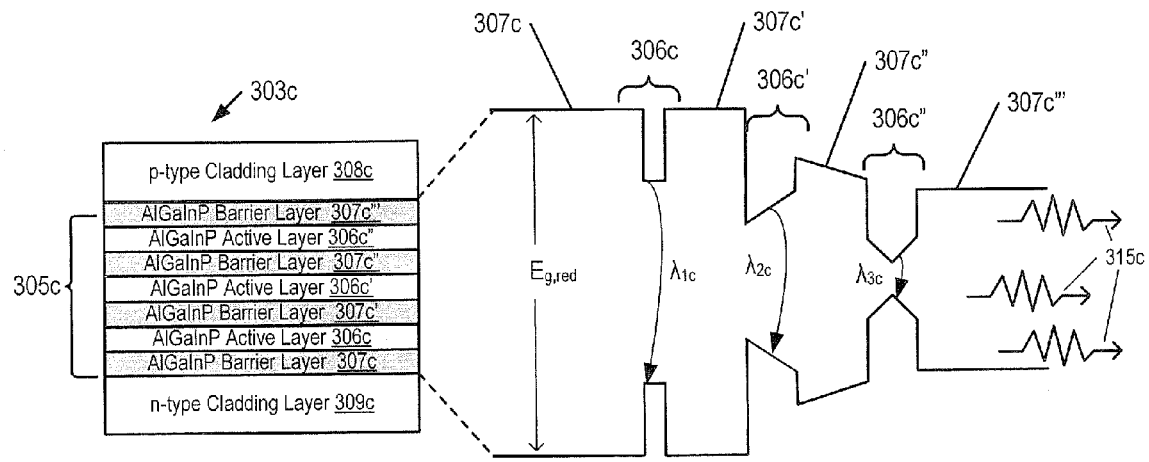

FIGS. 3A-3C illustrate broadband LED chips and corresponding energy band diagrams according to other embodiments of the present invention. In the broadband LED chips of FIGS. 3A-3C, the stoichiometries of one or more of the barrier layers and/or the quantum well active layers are altered to aid performance.

More particularly, referring now to FIG. 3A, a blue LED chip 303a includes a gallium nitride (GaN) based active region 305a between a p-type cladding layer 308a and n-type cladding layer 309a. The GaN based active region 305a is a multi-quantum well structure including a plurality of alternating InGaN active layers 306a, 306a', and 306a'' and GaN barrier layers 307a, 307a', 307a'', and 307a'''. In some embodiments, the LED chip 303a may correspond to the LED chip 103a of FIG. 1A. In addition, the active layers 306a, 306a', and 306a'' may be configured similarly to the active layers 206a, 206a', and 206a'' of the LED chip 203a of FIG. 2A to provide blue output light 315a. However, the regions surrounding the quantum well active layers 306a, 306a', and 306a" have varying stoichiometries, and as such, are shaped differently relative to one another. In particular, the barrier layers 307a, 307a', 307a", and 307a''' have differing ratios of gallium to nitride that are selected to define a plurality of sequentially decreasing bandgap energies. The gallium concentrations may also be varied over the thickness of the barrier layers 307a' and 307a" between the active layers 306a, 306a', and 306a" to provide stepwise and/or continuous grading, while the barrier layers 307a and 307a''' adjacent the cladding layers 309a and 308a may have fixed gallium concentrations. Thus, the relative concentrations of the barrier layers 307a, 307a', 307a", and 307a''' may be selected to guide and/or enhance recombination to provide improved efficiency in light emission over a blue wavelength range (e.g., about 410 nm to about 495 nm).

Similarly, referring now to FIG. 3B, a green LED chip 303b includes an indium gallium nitride (InGaN) based active region 305b between a p-type cladding layer 308b and n-type cladding layer 309b. The InGaN based active region 305b is a multi-quantum well structure including a plurality of alternating InGaN active layers 306b and 306a' and InGaN barrier layers 307b, 304b', and 307b". In some embodiments, the LED chip 303b may correspond to the LED chip 103b of FIG. 1A. In addition, the active layers 306b and 306a' may be configured similarly to the active layers 206b and 206a' of the LED chip 203b of FIG. 2B to provide green output light 315b. However, the barrier layers 307b, 304b', and 307b" have differing ratios of indium and gallium that are selected to define a plurality of sequentially decreasing bandgap energies. In addition, the indium and/or gallium concentration may be varied over the thickness of the barrier layer 304b' to provide stepwise and/or continuous grading, while the barrier layers 307b and 307b" adjacent the cladding layers 309b and 308b may have fixed concentrations. Thus, the relative concentrations of the barrier layers 307b, 304b', and 307b" may be selected to guide and/or enhance recombination to provide improved efficiency in light emission over a green wavelength range (e.g., about 495 nm to about 590 nm).

Likewise, referring now to FIG. 3C, a red LED chip 303c includes an aluminum gallium indium phsophide (AlGaInP) based active region 305c between a p-type cladding layer 308c and n-type cladding layer 309c. The InGaN based active region 305c is a multi-quantum well structure including a plurality of alternating AlGaInP active layers 306c, 306c', and 306c" and AlGaInP barrier layers 307c, 307c', 307c", and 307c'''. In some embodiments, the LED chip 303c may correspond to the LED chip 103c of FIG. 1A. However, the active layers 306c, 306c', and 306c" may have differing ratios of aluminum, gallium, and/or indium that are selected to define a plurality of differing bandgap energies to provide red output light 315c. In particular, the aluminum, gallium, and/or indium concentrations may be varied over the thickness of the active layers 306c' and 306c" while the active layer 306c may have a fixed concentration, to provide quantum well structures of differing shapes relative to one another. Likewise, the barrier layers 307c, 307c', 307c", and 307c''' have differing ratios of aluminum, gallium, and/or indium that are selected to define a plurality of differing bandgap energies. The aluminum, gallium, and/or indium concentrations may be varied over the thickness of the barrier layer 307c" to provide stepwise and/or continuous grading, while the barrier layers 307c, 307c', and 307c''' may have fixed concentrations. Thus, the relative concentrations of the barrier layers 307c, 307c', 307c", and 307c''' and/or the active layers 306c, 306c', and 306c" may be selected to guide and/or enhance recombination to provide higher efficiency in light emission over a red wavelength range (e.g., about 600 nm to about 720 nm).

FIGS. 4A-4D are graphs illustrating example spectral emission characteristics of light emitting device lamps according to some embodiments of the present invention. FIG. 4A illustrates an example spectral output of a blue broadband LED chip according to some embodiments of the present invention, such as the LED chips 103a, 203a, and 303a of FIGS. 1A, 2A, and 3A. As shown in FIG. 4A, the light emitted by the blue LED chip defines an asymmetric spectral distribution 415a over the blue wavelength range (e.g., about 410 nm-495 nm), as a result of the combination of different narrowband emission wavelengths 416a provided by the active layers of the multi-quantum well blue broadband LED chip. The spectral distribution 415a is centered at a wavelength (also referred to herein as a "center wavelength") of about 465 nm, while a peak wavelength 420a of the spectral distribution 415a occurs toward an end of the blue wavelength range, for example, at about 480 nm.

FIG. 4B illustrates an example spectral output of a green broadband LED chip, according to some embodiments of the present invention, such as the LED chips 103b, 203b, and 303b of FIGS. 1A, 2B, and 3B. Referring now to FIG. 4B, the light emitted by the green LED chip defines an asymmetric spectral distribution 415b over the green wavelength range (e.g., about 495 nm-590 nm), resulting from the combination of different narrowband emission wavelengths 416b provided by the active layers of the multi-quantum well green broadband LED chip. The spectral distribution 415b is centered at a wavelength of about 535 nm, while a peak wavelength 420b of the spectral distribution 415b occurs toward an end of the green wavelength range, for example, at about 560 nm.

FIG. 4C illustrates an example spectral output of a red broadband LED chip according to some embodiments of the present invention, such as the LED chips 103c, 203c, and/or 303c of FIGS. 1A, 2C, and 3C. As shown in FIG. 4C, the light emitted by the red LED chip defines an asymmetric spectral distribution 415c over the red wavelength range (e.g., about 600 nm-720 nm), as a result of the combination of different narrowband emission wavelengths 416c provided by the active layers of the multi-quantum well red broadband LED chip. The spectral distribution 415c is centered at a wavelength of about 665 nm, while a peak wavelength 420c of the spectral distribution 415c occurs toward an end of the red wavelength range, for example, at about 690 nm.

FIG. 4D illustrates the combined spectral output of an LED lamp including blue, green, and red broadband LED chips according to some embodiments of the present invention, such as the LED lamp 100 of FIG. 1A. Referring now to FIG. 4D, the spectral distributions 415a, 415b, and 415c of the blue, green, and red broadband LEDs combine to provide an overall spectral distribution 400 that approximates the spectral distribution of, for example, sunlight. However, as noted above, the shape of the emission spectra of the individual LEDs may be altered to provide other desired spectral outputs by adjusting the stoichiometries and/or material compositions of the active layers of the blue, green, and/or red broadband LED chips. In addition, the relative concentrations of the active layers may be designed to produce an optimal spectrum under particular operating conditions, taking into account, for example, the impact of thermal effects, increased current density, etc. The center wavelengths of adjacent spectral distributions 415a, 415b, and 415c (shown in FIG. 4D at 465 nm, 535 nm, and 665 nm, respectively) may be separated by less than a sum of the corresponding half width at half maximum values in some embodiments. In some embodiments, the energy (or number of photons) emitted at any wavelength within the spectral distribution 400 may not exceed about 125% of the energy (or number of photons)

emitted at another wavelength by any one of the blue, green, or red LED chips individually. Also, as LED lamps according to some embodiments of the present invention do not include light conversion materials, such as phosphors, operating efficiency may be improved.

Figure 5A:
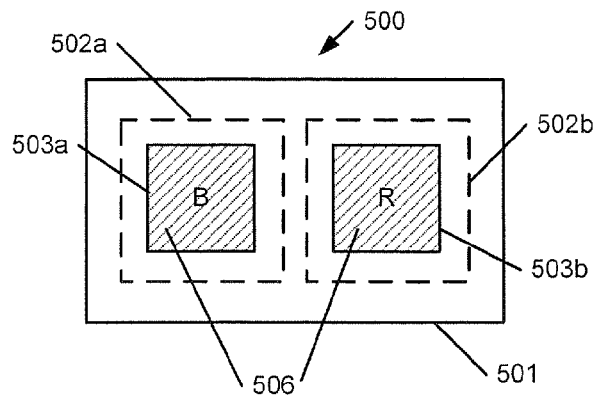
FIG. 5A is a top view illustrating a light emitting device lamp according to further embodiments of the present invention.
Figure 5B:
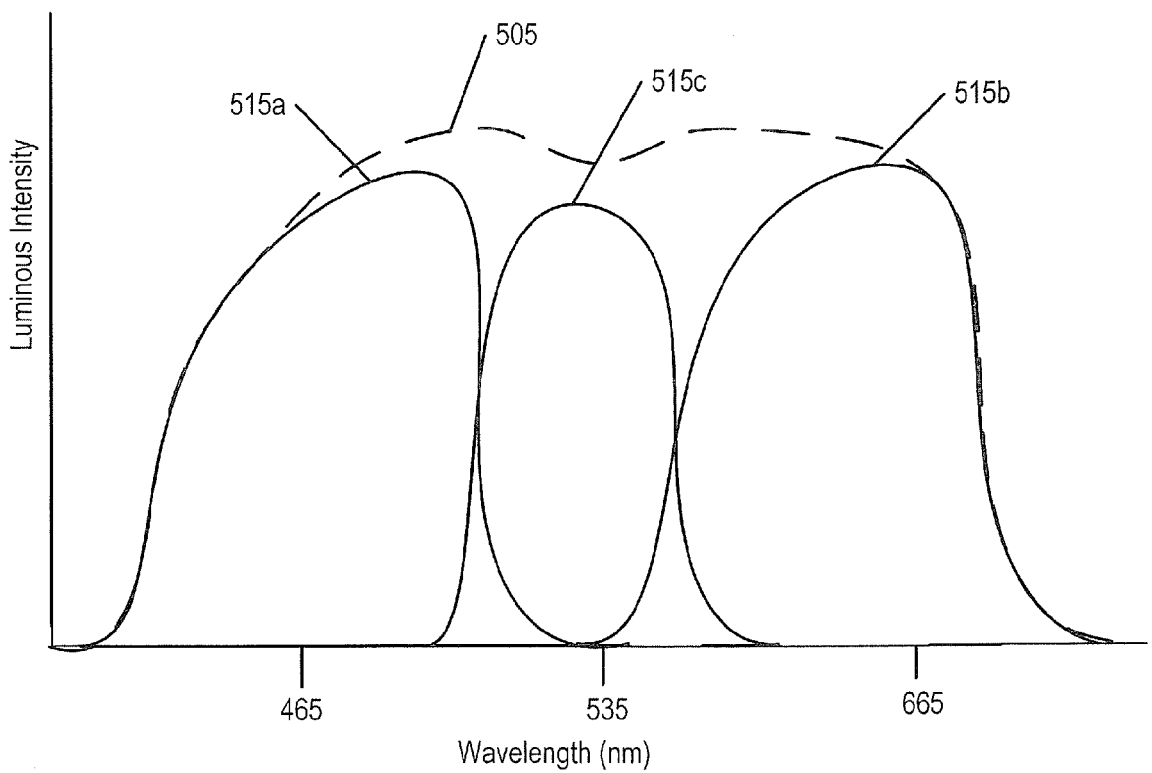
FIG. 5B is a graph illustrating example spectral emission characteristics of light emitting device lamps according to further embodiments of the present invention.

FIGS. 5A and 5B illustrate LED lamps and corresponding spectral outputs according to further embodiments of the present invention. Referring now to FIG. 5A, a multi-chip LED lamp 500 includes a common substrate or submount 501 including first and second die mounting regions 502a and 502b. The die mounting regions 502a and 502b are each configured to accept a broadband LED chip. The first and second broadband LED chips 503a and 503b are mounted on the die mounting regions 502a and 502b of the submount 501, respectively. A light conversion material 506, such as a phosphor, is configured to absorb at least some of the light emitted by at least one of the broadband LED chips 503a and 503b and re-emit light of a different wavelength. In some embodiments, the light conversion material 506 may be configured to emit light over a wavelength range between that of the light emitted by the first and second broadband LED chips 503a and 503b. It is recognized that the light conversion material 506 may differ in thickness or composition across the multi chip LED lamp 500. In one embodiment, LED 503a may excite light conversion material 506 that is configured to absorb at wavelength $\lambda_{absorb,B}$ and emit at $\lambda_{emit,B}$ while LED 503b may excite light conversion material 506 that is configured to absorb at wavelength $\lambda_{absorb,R}$ and emit at $\lambda_{emit,R}$. In this illustrative example, the distribution $\lambda_{emit,B}$ may or may not overlap $\lambda_{emit,R}$.

More particularly, as shown in FIG. 5A, the first broadband LED chip 503a is a blue LED chip configured to emit light in a blue wavelength range (i.e., between about 410-495 nm), and the second LED chip 503b is a red LED chip configured to emit light in a red wavelength range (i.e., between about 600-720 nm). For example, the first LED chip 503a may comprise a GaN multi-quantum well active region configured to provide broadband light output in the blue wavelength range, such as the LED chip 203a of FIG. 2A. Likewise, the second LED chip 503b may comprise an AlGaInP multi-quantum well active region configured to provide broadband light output in the red wavelength range, such as the LED chip 203c of FIG. 2C.

Still referring to FIG. 5A, the light conversion material 506 is a green phosphor, such as LuAG (Lanthanide+YAG), that is configured to absorb at least some of the light emitted by the broadband LED chips 503a and 503b and re-emit light in a green wavelength range (i.e., between about 495-590 nm). The light conversion material 506 may be provided to at least partially cover one or both of the LED chips 503a and/or 503b using many different techniques. For example, the light conversion material 506 may be included in an encapsulant material in a plastic shell surrounding the LED chips 503a and/or 503b. In addition and/or alternatively, the light conversion material 506 may be directly coated on the LED chips 503a and/or 503b, for example, as described in U.S. Patent Publication No. 2006/0063289, assigned to the assignee of the present invention. In other techniques, the light conversion material 506 may be coated on the LED chips 503a and/or 503b using spin coating, molding, screen printing, evaporation and/or electrophoretic deposition. Furthermore, the light conversion material 506 may be provided by a semiconductor material, such as a direct bandgap semiconductor. As such, the light emitted by the first and second broadband LED chips 503a and 503b and the light conversion material 506 combines to provide white light.

FIG. 5B illustrates the combined spectral output of an LED lamp including blue and red broadband LED chips and a green phosphor according to some embodiments of the present invention, such as the LED lamp 500 of FIG. 5A. Referring now to FIG. 5B, the blue and red broadband LED chips 503a and 503b respectively emit light having center wavelengths of about 465 and 665 nm over a range of about 100 nm, as illustrated by spectral distributions 515a and 515b. As shown in FIG. 5B, the center wavelengths are separated by greater than the sum of the respective half width at half maximum values of the spectral distributions 515a and 515b. The spectral distributions 515a and 515b are asymmetric, with peak wavelengths occurring towards ends of the blue and red wavelength ranges, respectively. In addition, the light conversion material 506 absorbs at least some of the light from the blue and red LED chips 503a and 503b and emits light having a center wavelength of about 535 nm over a range of about 100 nm as shown by spectral distribution 515c. The combination of the light emitted by the blue and red broadband LED chips 503a and 503b and the green light conversion material 506 combines to provide an overall spectral distribution 505, which is perceived as white light.

Although illustrated in FIGS. 5A-5B with reference to specific materials, different materials may be selected for the first and second broadband LED chips 503a and 503b and/or the light conversion material 506 to provide relatively high-CRI white light output at a relatively high efficiency. In addition, although illustrated as including two broadband LED chips and a single light conversion material, additional broadband LEDs and/or light conversion materials may be included in LED lamps according to some embodiments of the present invention to provide a desired spectral output.

Accordingly, multi-chip lamps including a plurality of broadband LED chips according to some embodiments of the present invention may be configured to provide high-CRI white light output with relatively high efficiency in comparison to conventional LED-based lamps. The broadband LED chips discussed herein may be fabricated using, for example, epitaxial growth on suitable substrates using Metal Organic Vapor Phase Epitaxy (MOVPE), Hydride Vapor Phase Epitaxy (HVPE), Molecular Beam Epitaxy (MBE), and/or other techniques. In addition, the LED chips may be fabricated using patterning, etching, and/or dielectric and metal deposition techniques and/or other techniques.

The size and design of the broadband LED chips described herein may be adjusted and/or optimized to provide a desired spectral output such as, for example, a number of photons emitted for a given current. The individual broadband LEDs may also be adjusted in size and/or design to provide for a better match to the drive current source. Alternatively, each broadband LED in a multi-chip lamp according to some embodiments of the present invention may be excited with a separate current source so that the relative light emitted may be adjusted and/or optimized to achieve a desired overall spectral output.

In the drawings and specification, there have been disclosed exemplary embodiments of the invention. However, many variations and modifications can be made to these embodiments without substantially departing from the principles of the present invention. Accordingly, although specific terms are used, they are used in a generic and descriptive sense only and not for purposes of limitation, the scope of the invention being defined by the following claims.

That which is claimed:

1. A multi-chip light emitting device (LED) lamp for providing white light, comprising:

a first broadband LED chip including a multi-quantum well active region comprising a first plurality of alternating active and barrier layers, the first plurality of active layers respectively comprising different relative concentrations of at least two elements of a first semiconductor compound and respectively configured to emit light of a plurality of different emission wavelengths over a first wavelength range; and a second broadband LED chip including a multi-quantum well active region comprising a second plurality of alternating active and barrier layers, the second plurality of active layers respectively comprising different relative concentrations of at least two elements of a second semiconductor compound and respectively configured to emit light of a plurality of different emission wavelengths over a second wavelength range including wavelengths greater than those of the first wavelength range, wherein the second semiconductor compound has a narrower bandgap than the first semiconductor compound, wherein the light emitted by the first and/or second broadband LED chips defines an asymmetric spectral distribution over the first and/or second wavelength ranges, respectively, and wherein the light emitted by the first and second broadband LED chips combines to provide an appearance of white light.

2. The multi-chip LED lamp of claim 1, wherein a spectral distribution of the light emitted by at least one of the first and second broadband LED chips has a full width at half maximum (FWHM) of greater than about 35 nanometers (nm).

3. The multi-chip LED lamp of claim 1, wherein a nonradiative energy loss associated with the light emitted by the second broadband LED chip is less than that of the light emitted by the first broadband LED chip.

4. The multi-chip LED lamp of claim 1, wherein the light emitted by the first broadband LED chip defines a first spectral distribution over the first wavelength range, wherein the light emitted by the second broadband LED chip defines a second spectral distribution over the second wavelength range, and wherein a separation between respective center wavelengths of the first and second spectral distributions is not greater than a sum of respective half width at half maximum values of the first and second spectral distributions.

5. The multi-chip LED lamp of claim 1, further comprising:

a third broadband LED chip including a multi-quantum well active region comprising a third plurality of alternating active and barrier layers, the third plurality of active layers respectively comprising different relative concentrations of at least two elements of a third semiconductor compound and respectively configured to emit light of a plurality of different emission wavelengths over a third wavelength range including wavelengths greater than those of the second wavelength range, wherein the third semiconductor compound has a narrower bandgap than the second semiconductor compound, and wherein the light emitted by the first, second, and third broadband LED chips combines to provide the appearance of white light.

6. The multi-chip LED lamp of claim 5, wherein a nonradiative energy loss associated with the light emitted by the third broadband LED chip is less than that of the light emitted by the second broadband LED chip.

7. The multi-chip LED lamp of claim 5, wherein the light emitted by the first broadband LED chip defines a first spectral distribution over the first wavelength range, wherein the light emitted by the second broadband LED chip defines a second spectral distribution over the second wavelength range, wherein the light emitted by the third broadband LED chip defines a third spectral distribution over the third wavelength range, wherein a separation between respective center wavelengths of the first and second spectral distributions is not greater than a sum of respective half width at half maximum values of the first and second spectral distributions, and wherein a separation between respective center wavelengths of the second and third spectral distributions is not greater than a sum of respective half width at half maximum values of the second and third spectral distributions.

8. The multi-chip LED lamp of claim 5, wherein the first wavelength range corresponds to blue light, wherein the second wavelength range corresponds to green light, and wherein the third wavelength range corresponds to red light.

9. The multi-chip LED lamp of claim 8, wherein each of the first, second, and third wavelength ranges are greater than about 30 nanometers (nm).

10. The multi-chip LED lamp of claim 1, wherein an energy associated with light emitted at a wavelength within the first and/or second wavelength ranges is no more than about 125% of an energy associated with the light emitted at another wavelength within the first and/or second wavelength ranges by one of the first and second broadband LED chips.

11. The multi-chip LED lamp of claim 1, wherein a number of photons emitted at a wavelength within the first and/or second wavelength ranges is no more than about 125% of a number of photons emitted at another wavelength within the first and/or second wavelength ranges by one of the first and second broadband LED chips.

12. The multi-chip LED lamp of claim 1, wherein the lamp does not comprise a light conversion material.

13. The multi-chip LED lamp of claim 1, wherein the first and/or second plurality of barrier layers respectively comprise graded concentrations of the respective elements of the first and/or second semiconductor compounds based on the relative concentrations of the respective first and/or second plurality of active layers to enhance recombination of carriers therein.

14. The multi-chip LED lamp of claim 1, wherein the first and second semiconductor compounds comprise different group III-V compounds.

15. The multi-chip LED lamp of claim 1, wherein the first semiconductor compound comprises GaN.

16. The multi-chip LED lamp of claim 15, wherein the plurality of first active layers comprises a first layer of $In_{0.13}Ga_{0.87}N$, a second layer of $In_{0.15}Ga_{0.85}N$, and a third layer of $In_{0.17}Ga_{0.83}N$.

17. The multi-chip LED lamp of claim 1, wherein the second semiconductor compound comprises InGaN.

18. The multi-chip LED lamp of claim 17, wherein the plurality of second active layers comprises a first layer of $In_xGa_{1-x}N$ and a second layer of $In_yGa_{1-y}N$, where x and y are not equal.

19. The multi-chip LED lamp of claim 17, wherein the plurality of second active layers comprises a first layer of $In_{0.20}Ga_{0.80}N$, a second layer of $In_{0.22}Ga_{0.78}N$, and a third layer of $In_{0.26}Ga_{0.74}N$.

20. The multi-chip LED lamp of claim 5, wherein the third semiconductor compound comprises AlGaInP.

21. The multi-chip LED lamp of claim 20, wherein the plurality of third active layers comprises a first layer of $Al_xGa_yIn_{1-x-y}P$ and a second layer of $Al_wGa_zIn_{1-w-z}P$, where x and w are not equal, and where y and z are not equal.

22. The multi-chip LED lamp of claim 1, wherein the light emitted by the first broadband LED chip defines a first spectral distribution over the first wavelength range, wherein the light emitted by the second broadband LED chip defines a second spectral distribution over the second wavelength range, and wherein a separation between respective center wavelengths of the first and second spectral distributions is not less than a sum of respective half width at half maximum values of the first and second spectral distributions.

23. The multi-chip LED lamp of claim 22, further comprising:
   a light conversion material configured to absorb at least some of the light emitted by the first and/or second broadband LED chips and re-emit light of a plurality of different emission wavelengths over a third wavelength range between the first and second wavelength ranges such that the light emitted by the first and second broadband LED chips and the light conversion material combines to provide the white light.

24. The lamp of claim 23, wherein the light conversion material is not directly on the first and/or second broadband LED chips.

25. A multi-chip light emitting device (LED) lamp for providing white light, comprising:
   a blue broadband LED chip including a multi-quantum well active region comprising a first plurality of alternating active and barrier layers, the first plurality of active layers respectively comprising different relative concentrations of at least two elements of a first semiconductor compound and respectively configured to emit light of a plurality of different emission wavelengths over a blue wavelength range to define a blue spectral distribution having a full width at half maximum (FWHM) of greater than about 40 nanometers (nm);
   a green broadband LED chip including a multi-quantum well active region comprising a second plurality of alternating active and barrier layers, the second plurality of active layers respectively comprising different relative concentrations of at least two elements of a second semiconductor compound and respectively configured to emit light of a plurality of different emission wavelengths over a green wavelength range to define a green spectral distribution having a full width at half maximum (FWHM) of greater than about 40 nanometers (nm); and
   a red broadband LED chip including a multi-quantum well active region comprising a third plurality of alternating active and barrier layers, the third plurality of active layers respectively comprising different relative concentrations of at least two elements of a third semiconductor compound and respectively configured to emit light of a plurality of different emission wavelengths over a red wavelength range to define a red spectral distribution having a full width at half maximum (FWHM) of greater than about 50 nanometers (nm),
   wherein the light emitted by the blue, green, and red LED chips combines to provide an appearance of white light.

26. The multi-chip LED lamp of claim 25, wherein the second semiconductor compound has a narrower bandgap than the first semiconductor compound and a nonradiative energy loss associated with the light emitted by the green LED chip is less than that of the light emitted by the blue LED chip, and wherein the third semiconductor compound has a narrower bandgap than the second semiconductor compound and a nonradiative energy loss associated with the light emitted by the red LED chip is less than that of the light emitted by the green LED chip.

27. The multi-chip LED lamp of claim 25, wherein the light emitted by the blue, green, and/or red LED chips defines an asymmetric spectral distribution over the respective wavelength ranges.

28. The multi-chip LED lamp of claim 25, wherein the lamp does not comprise a light conversion material.

29. The multi-chip LED lamp of claim 25, wherein the first semiconductor compound comprises GaN, wherein the second semiconductor compound comprises InGaN, and wherein the third semiconductor compound comprises AlGaInP.

30. The multi-chip LED lamp of claim 25, wherein a separation between respective center wavelengths of the blue and green spectral distributions is not greater than a sum of respective half width at half maximum values of the blue and green spectral distributions, and wherein a separation between respective center wavelengths of the red and green spectral distributions is not greater than a sum of respective half width at half maximum values of the red and green spectral distributions.

* * * * *

UNITED STATES PATENT AND TRADEMARK OFFICE
CERTIFICATE OF CORRECTION

| | |
|---|---|
| PATENT NO. | : 8,022,388 B2 |
| APPLICATION NO. | : 12/371226 |
| DATED | : September 20, 2011 |
| INVENTOR(S) | : Brandes |

It is certified that error appears in the above-identified patent and that said Letters Patent is hereby corrected as shown below:

In the Claims:
Column 20, Claim 21, Line 62: Please correct "first layer of $Al_x$-"
to read -- first layer of $Al_x$ --

Signed and Sealed this
Seventh Day of February, 2012

David J. Kappos
*Director of the United States Patent and Trademark Office*